United States Patent
Lewis et al.

[11] Patent Number: 5,906,315
[45] Date of Patent: May 25, 1999

[54] WATCHDOG TIMER FOR CONTROLLING A COOLING SYSTEM

[75] Inventors: Quentin J. Lewis, Litchfield; Garry M. Tobin, Atkinson, both of N.H.; Kenneth Mark Leigh, Lowell; Arthur H. Cianelli, Methuen, both of Mass.

[73] Assignee: Sun Microsystems, Inc., Mountain View, Calif.

[21] Appl. No.: 09/074,975

[22] Filed: May 8, 1998

[51] Int. Cl.[6] ........................................... F24F 7/00
[52] U.S. Cl. ................ 236/49.3; 62/126; 62/259.2; 364/187; 361/695; 236/DIG. 9
[58] Field of Search ............. 236/49.3, DIG. 2, 236/DIG. 9; 165/80.2, 80.3, 104.33; 361/695, 696, 697; 257/713, 721, 722; 62/259.2, 125, 126, 127, 129, 130; 364/184, 187, 557

[56] References Cited

U.S. PATENT DOCUMENTS

| | | |
|---|---|---|
| 4,333,316 | 6/1982 | Stamp, Jr. et al. ................. 62/126 |
| 4,821,528 | 4/1989 | Tershak ............................. 62/126 X |
| 5,276,630 | 1/1994 | Baldwin et al. ................. 364/187 X |
| 5,790,430 | 8/1998 | Steiert ............................. 361/695 X |
| 5,831,525 | 11/1998 | Harvey ........................... 361/695 X |

*Primary Examiner*—Harry B. Tanner
*Attorney, Agent, or Firm*—Blakely Sokoloff Taylor & Zafman

[57] ABSTRACT

A system and method for preventing a computer system from overheating when a processor or software controlling the processor which controls the cooling system fails. The apparatus utilizes a watchdog timer which receives periodic signals confirming proper operation of the processor. When these status signals are not received, the watchdog timer transmits signals causing the cooling system that prevents overheating of the computer system.

18 Claims, 2 Drawing Sheets

WATCHDOG TIMER FOR CONTROLLING A COOLING SYSTEM

BACKGROUND OF THE INVENTION

1. Field of the Invention

The present invention relates generally to the field of computer systems. More specifically, the invention relates to an apparatus and method for preventing overheating of a computer system.

2. Background

Modern day computer systems place increasingly powerful central processing units (CPUs) in small enclosed structures or packages. The increased speed of the CPUs often results in generation of heat in the enclosed structure which requires a cooling system, usually a cooling fan, to keep the computer system from overheating. A failure of the fan may result in overheating of this computer system and damage to the circuitry within the computer. Such damage can be extremely expensive.

In order to minimize costs and to fully utilize the excess power provided by powerful CPUs, modern computer systems increasingly integrate as many functions as possible into the central processing unit. Operating system software controls operation of the central processing unit. Thus, in many designs, operating systems or other software controls a CPU which controls the fans that cool the computer system. As the computer system gets hotter, the cooling fans typically run faster increasing the rate of airflow and cooling the computer system to prevent overheating.

One problem with integration of cooling functions into the CPU is that when the CPU fails or the software controlling the CPU fails, the cooling system controlled by the CPU also fails. Cooling system failure may result in overheating of circuitry, and expensive damage to computer system circuits.

Thus, an apparatus or method is needed which will prevent the system from overheating in the event that the software or circuitry controlling the cooling system fails.

SUMMARY OF THE INVENTION

The present invention describes an apparatus for maintaining operation of a cooling system in the event that the software or a processor controlling a cooling system fails. In one embodiment of the invention, a watchdog timer periodically receives status signals from the processor controlling the cooling system. While the watchdog timer receives the periodic status signal from the processor indicating proper operation, the processor controls the cooling system. When the watchdog timer does not receive the expected periodic status signal from the processor, the watchdog timer asserts control of the cooling system. In one embodiment of the invention, the watchdog timer automatically adjusts the cooling system to handle a worst-case condition.

DETAILED DESCRIPTION OF THE INVENTION

An apparatus and method for detecting failure of a processor which controls a cooling system and ensuring that when such failure occurs, the cooling system continues operation. In the following description, numerous specific details are set forth. For example, the cooling system described uses cooling fans to cool a computer system, although other cooling mechanisms may be used. Time delays are also included in order to provide an example and facilitate a thorough understanding of the present invention. However, it will be obvious to one skilled in the art that the invention may be practiced without these specific details.

Figure 1:
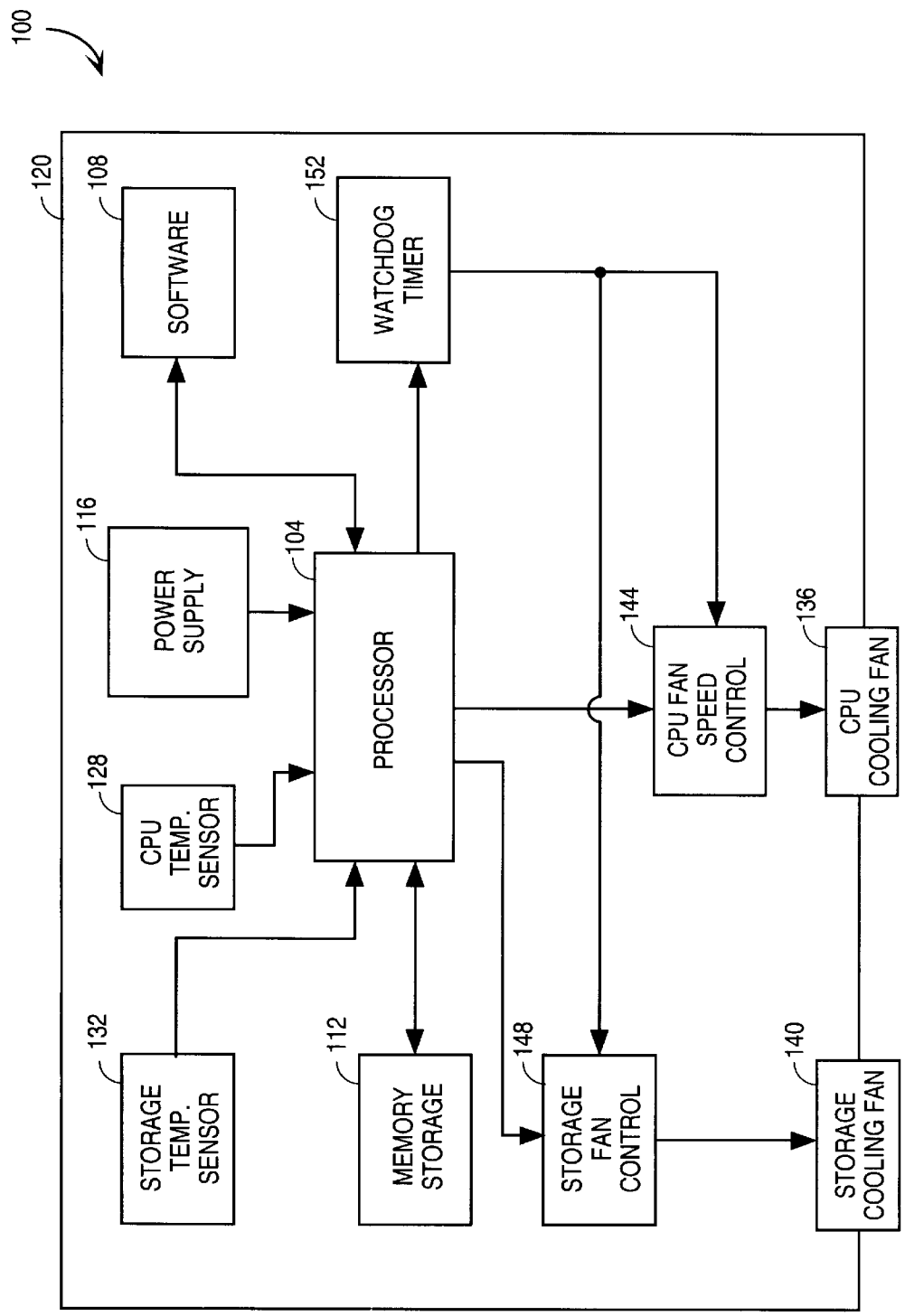
FIG. 1 is an overall block diagram of one embodiment of the cooling system, as used in a computer system.

FIG. 1 illustrates one embodiment of the invention to cool a computer system 100. A processor 104, typically a microprocessor or central processing unit (CPU) controls operation and performs computations for computer system 100. Software 108 such as operating systems software or bios typically directs processor 104 operation. The processor 104 may further be coupled to a memory 112 a power supply 116 and other elements used in a typical computer system 100. The entire computer system is typically encased in a casing 120 which protects the processor 104 and other circuit elements from damage. However, the casing 120 also traps heat generated by the circuit elements. The resulting heat accumulation can damage the circuit elements including processor 104 and memory 112.

In order to control heat build-up, the processor 104 typically controls a cooling system. In one embodiment, the cooling system cools the processor itself. A plurality of temperature sensors 128, 132 within the computer system 100 detect the temperature of the processor 104, the ambient air temperature within the case 120 or the temperature of various other components such as memory 112 or power supply 116. Typically, the sensors are positioned to sense the temperature near the most heat-sensitive component. The information from the temperature sensors 128, 132 is provided to the processor 104 which uses the information to control the cooling system during normal operation. Normal operation, for purposes of this invention is defined as when the processor 104 is operating as expected, typically receiving temperature signals from temperature sensors, computing appropriate cooling system setting and transmitting status signals to a watchdog timer 152.

During normal operation, the processor 104 running software 108 uses the information from temperature sensors 128 and 132 to determine settings for the cooling system. In the illustrated embodiment, the cooling devices used by the cooling system are cooling fans 136, 140 to move air through the case 120 of computer system 100 to prevent circuit components and devices from overheating. Other possible cooling devices include, but are not limited, to refrigeration systems and liquid based cooling systems. In the illustrated embodiment, the speed of the cooling fan 136, 140 typically determines the amount of cooling. Usually, the speed of the fans is kept to the minimum necessary to prevent overheating because higher cooling fan 136, 140 speeds result in increased fan power consumption and excessive fan noise. The noise of the cooling fans 136, 140 is typically unpleasant and can be distracting to a computer user. Thus, cooling fan speeds are kept at the minimum necessary, taking into account a margin of error, to prevent computer system 100 from overheating.

Fan speed controls 144, 148 adjust the speed of the corresponding cooling fan 136, 140. In the illustrated embodiment, a first cooling fan 144 controls the fan speed for a CPU cooling fan 136 which cools processor 104 and a second speed control 148 controls the speed of a storage cooling fan 140 which cools memory 112. Processor 104 transmits control signals to the respective cooling fans 136, 140, indicating the rotation speed of the fan needed in order to avoid overheating. In summary, temperature sensor 128, 132 transmits a temperature signal containing temperature information to the processor 104 which processes the information and transmits a control signal to the fan speed controls 144, 148. The control signal determines the speed of cooling fans 136, 140.

One problem with the described cooling system is that when processor 104 fails, or when problems occur with the software 108, the signal output by the processor 104 may be incorrect or in a worst case scenario, the processor 104 may not transmit any signal to the fan speed controls 144, 148. A low fan speed may result in insufficient air being transferred through the computer system 100 and overheating of circuitry. Thus, a watchdog timer 152 monitors status signals output by the processor 104. When the watchdog timer detects improper operation of the processor 104 or software 108, the watchdog timer 152 assumes control of the cooling system and transmits processor failure signals to the fan speed controls 144 and 148 instructing the cooling fans 136, 140 to operate at a sufficient speed to handle a worst-case condition. In one embodiment of the invention, the watchdog timer 152 causes the cooling device or cooling fans 136, 140 to operate at a maximum level or speed. The noise generated by operating the cooling fans 136, 140 at full power serves to notify users that a problem exists with the processor 104 or software 108.

Watchdog timer 152 determines when processor 104 has failed by monitoring status signals from the processor 104. Processor 104 is configured to periodically transmit a status signal to the watchdog timer 152. In one embodiment of the invention, the processor 104 automatically transmits periodically the status signal. In an alternate embodiment, the watchdog timer 152 transmits a request signal or poll signal requesting a status signal from processor 104. Failure of the processor 104 to respond to the poll signal or to periodically transmit a status signal indicates improper operation of the processor 104 or software 108. Instructions for providing a status signal to the watchdog timer 152 is preferably programmed in a kernel of the bios software running in the processor 104. Programming status signal instructions in a kernel minimizes processor time and is well-suited to automatic periodic status signal outputs.

In one embodiment of the invention, the status signal is a reset signal automatically output by the processor at preset time intervals. The reset signal resets the watchdog timer 152. In the described embodiment, the watchdog timer may be implemented using a counter. The counter counts down from a predetermined time or wait time, for example, three minutes. When the processor 104 transmits the reset signal, the counter in watchdog timer 152 resets and again begins a countdown for the predetermined length of time or wait time. When the processor 104 and software 108 operate properly, the counter in watchdog timer 150 never counts down the full wait time of three minutes because the status signals from processor 104 are received in time intervals of less than three minutes, resetting the counter before countdown is complete. However, when the processor fails, status signals are not received and when the counter within watchdog timer 152 counts down the wait time, the watchdog timer 152 causes the fan speed control 148, 144 to automatically drive the cooling fans 136, 140 at full power to create a maximum cooling condition.

Other methods of implementing watchdog timers are also available. Watchdog timers may be implemented by monitoring the time it takes to shift a bit through a series of registers. Under normal conditions, status signals are received before the bit shifts through the shift register. Watchdog timers with very short wait times on the order of milliseconds are commercially available from Dallas Semiconductor of Dallas, Tex. and Maxim of Sunnyvale, Calif. Wait time is defined as the time after a status signal which may elapse before the watchdog timer transmits a warning signal. However, it is preferable to have watchdog timers with longer wait times then those commercially available, in particular, wait times on the order of minutes are preferred to avoid burdening the processor with sending frequent status signals. Long wait times are suitable because thermal effects usually occur over several minutes. One embodiment of a watchdog timer with a wait time of several minutes may be implemented by coupling an alarm to a calendar circuit. However, the scope of this invention should not be limited to a particular implementation or type of watchdog timer used.

Figure 2:
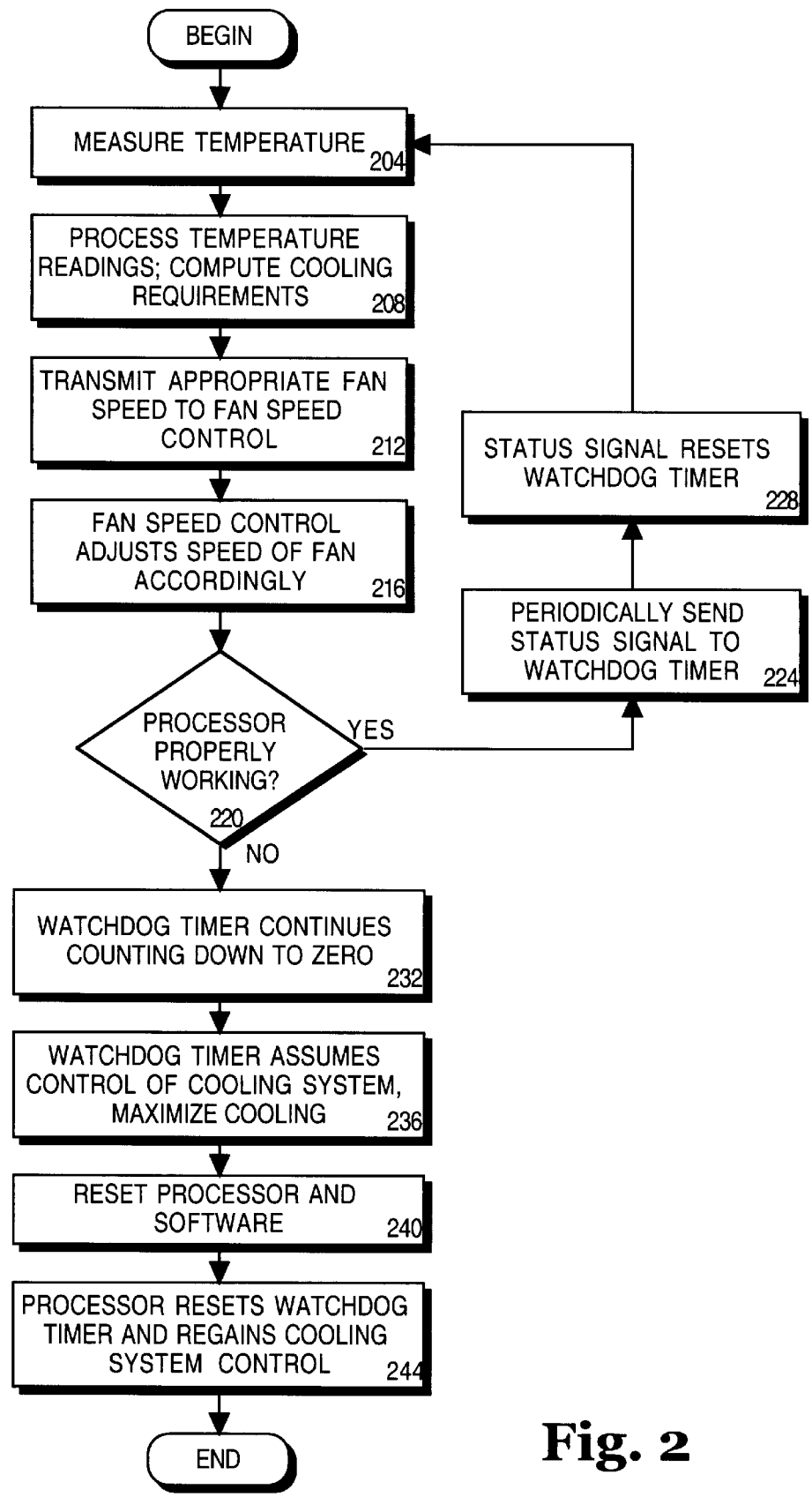
FIG. 2 is a flowchart describing the operation of the watchdog timer circuit for the cooling system of FIG. 1.

FIG. 2 is a flowchart illustrating the operation of the cooling system used in the computer system 100 of FIG. 1. In block 204, a sensor measures the temperature of components or ambient air within the computer system 100. The temperature readings are transmitted to a processor, typically a CPU, which processes the temperature readings to compute appropriate cooling requirements in block 208. In the illustrated embodiment, the cooling elements are fans, although other cooling systems such as liquid nitrogen or other liquid based systems may be used. In the illustrated embodiment in which the cooling system are fans, the processor uses the temperature readings to compute appropriate cooling requirements or fan speeds in block 208. The cooling requirements or fan speeds are transmitted to a fan speed control in block 212. In block 216, the fan speed control adjusts the speed of the cooling fans to prevent the computer system 100 from overheating.

In decision block 220, the watchdog timer must determine whether the processor controlling the cooling system, typically a CPU controlling the entire computer system is properly working. When the processor is properly working, the processor periodically sends status signals to the watchdog timer as illustrated in block 224. The watchdog timer uses the status signals to ascertain that the processor is properly working. In one embodiment of the invention, the status signals are reset signals which reset a timer or counter in the watchdog in block 228. Blocks 204 through 228 are repeated in a monitoring loop as long as the processor and software controlling the cooling elements operate properly.

In decision block 220, the watchdog timer may determine that the processor is not properly working. This occurs when the watchdog timer does not receive a status signal from the processor 104 after a predetermined time period or wait time. When an expected status signal is not received, the watchdog timer count down continues uninterrupted until it reaches a predetermined setting or zero time, as illustrated in block 232. When the counter in watchdog timer reaches a zero setting, the watchdog timer assumes control of the cooling system in block 236.

In one embodiment of the invention, the watchdog timer is a simple circuit and is not sophisticated enough to receive sensor control signals and process them. Thus, after determining that the processor controlling the cooling system has failed, the watchdog timer adjusts the cooling system controls (fan speed control is 144 and 148 in the embodiment illustrated in FIG. 1) to a setting or level sufficient to handle a worst case condition. One method of handling worst-case conditions sets the cooling fans to a maximum setting such that maximum speed cooling results. The additional noise generated by the cooling fans also serves to notify an end user that either the processor 104 or the software controlling the processor has failed.

The watchdog timer 152 retains control of the cooling system within the computer system 100 until the problem with the processor 104 or software 108 is corrected and the system return to normal operation. This may occur when a reset of the processor occurs as illustrated in block 240. Once the processor has been reset and the operation of the processor returns to normal, the processor may reset the watchdog timer and regain control of the cooling system in block 244.

The present invention described may be designed in many different ways using different design configurations and parameters. While the present invention has been described in terms of specific elements and embodiments, various other embodiments may come to mind to those skilled in the art without departing from the spirit and scope of the present invention. Thus, the preceding description should not be interpreted to limit the scope of the invention, instead the invention should be measured in terms of the claims which follow.

We claim:

1. A cooling system to cool an apparatus comprising:
   a cooling device;
   a processor that controls a setting of the cooling device during normal operation; and
   a watchdog timer coupled to said processor and said cooling device, said watchdog timer to turn said cooling device to a preset setting when said watchdog timer fails to receive a status signal from the processor after a predetermined period.

2. The cooling system of claim 1 wherein said preset level is set to handle a maximum level of heat generated by the apparatus.

3. The cooling system of claim 1 wherein the cooling device is a cooling fan and the preset setting is a cooling fan speed.

4. The cooling system of claim 1 further comprising:
   a temperature sensor coupled to the processor to indicate to the processor an ambient temperature around the processor, the ambient temperature used by the processor to determine a cooling device setting during normal operation.

5. The cooling system of claim 1 wherein the watchdog timer controls said cooling device until the processor is reset.

6. The cooling system of claim 1 wherein said processor is a central processing unit in a computer system and the cooling device setting during normal operation is determined by system software controlling the processor.

7. A method of preventing overheating of an apparatus cooled by a cooling device comprising:

receiving status signals from a processor controlling the cooling device, the status signals indicating normal operation of the processor; and
   transmitting a processor failure signal to set the cooling device to a setting sufficient to handle a worst case condition when the status signal from the processor has not been received for a predetermined period of time.

8. The method of claim 7 further comprising:
   transmitting periodically a polling signal to the processor requesting confirmation of processor operation.

9. The method of claim 7 further comprising:
   receiving a temperature signal from a temperature sensor, the processor using the temperature signal to adjust a setting of the cooling device during normal operation.

10. The method of claim 9 wherein the processor is a central processing unit in a computer system.

11. The method of claim 9 wherein the cooling device switches to a maximum setting upon receiving the processor failure signal.

12. The method of claim 7 further comprising:
    resetting the processor, after the processor failure signal is sent to the cooling device the resetting of the processor returning control of the cooling device to the processor.

13. The method of claim 7 wherein the cooling device is a cooling fan.

14. A computer system comprising
    a central processing unit;
    a cooling device to cool the computer system, a setting of the cooling device determined by the central processing unit;
    a watchdog timer coupled to the central processing unit, the watchdog timer configured to receive status signals from the central processing unit and to control the setting of the cooling device when the status signal is not received for a predetermined length of time.

15. The computer system of claim 14 wherein said cooling device is a cooling fan.

16. The computer system of claim 14 wherein the watchdog timer includes a counter which is reset upon receipt of the status signal.

17. The computer system of claim 14 further comprising:
    temperature sensors coupled to the central processing unit, the temperature sensors transmitting a temperature signal to the central processing unit for determining a setting of the cooling device.

18. The computer system of claim 14 wherein the watchdog timer has a wait time exceeding one minute.

* * * * *